United States Patent
Konsek et al.

(10) Patent No.: US 8,664,636 B2
(45) Date of Patent: Mar. 4, 2014

(54) NANOSTRUCTURED DEVICE

(75) Inventors: Steven Louis Konsek, Malmö (SE);
Yourii Martynov, Geldrop (NL); Jonas Ohlsson, Malmö (SE); Peter Jesper Hanberg, Söborg (DK)

(73) Assignee: GLO AB, Lund (SE)

( * ) Notice: Subject to any disclaimer, the term of this patent is extended or adjusted under 35 U.S.C. 154(b) by 10 days.

(21) Appl. No.: 13/133,371

(22) PCT Filed: Dec. 21, 2009

(86) PCT No.: PCT/SE2009/051479
§ 371 (c)(1),
(2), (4) Date: Jun. 7, 2011

(87) PCT Pub. No.: WO2010/071594
PCT Pub. Date: Jun. 24, 2010

(65) Prior Publication Data
US 2011/0240959 A1   Oct. 6, 2011

(30) Foreign Application Priority Data
Dec. 19, 2008   (SE) ...................... 0850167

(51) Int. Cl.
*H01L 33/04*   (2010.01)
(52) U.S. Cl.
USPC ............ 257/13; 257/E33.008; 257/E21.09; 438/478
(58) Field of Classification Search
USPC ............ 257/13, E21.09, E33.008; 438/478; 977/762
See application file for complete search history.

(56) References Cited

U.S. PATENT DOCUMENTS

| 6,340,822 B1 * | 1/2002 | Brown et al. ............ 257/25 |
| 7,335,908 B2 | 2/2008 | Samuelson et al. |
| 7,396,696 B2 | 7/2008 | Kim et al. |

(Continued)

FOREIGN PATENT DOCUMENTS

| GB | 2442768 A | 4/2008 |
| WO | 2007/104781 A2 | 9/2007 |
| WO | 2008/034823 A1 | 3/2008 |
| WO | 2008/048704 A2 | 4/2008 |

OTHER PUBLICATIONS

International Search Authority: Swedish Patent Office (ISA/SE). International Search Report, Application PCT/SE2009/051479. Mar. 18, 2010.

(Continued)

*Primary Examiner* — Stephen W Smoot
*Assistant Examiner* — Edward Chin
(74) *Attorney, Agent, or Firm* — The Marbury Law Group PLLC

(57) ABSTRACT

A nanostructured device according to the invention comprises a first group of nanowires protruding from a substrate where each nanowire of the first group of nanowires comprises at least one pn- or p-i-n-junction. A first contact, at least partially encloses and is electrically connected to a first side of the pn- or p-i-n-junction of each nanowire in the first group of nanowires. A second contacting means comprises a second group of nanowires that protrudes from the substrate, and is arranged to provide an electrical connection to a second side of the pn- or p-i-n-junction.

16 Claims, 8 Drawing Sheets

(56) References Cited

U.S. PATENT DOCUMENTS

| | | | |
|---|---|---|---|
| 7,521,274 B2 * | 4/2009 | Hersee et al. | 438/41 |
| 7,608,905 B2 * | 10/2009 | Bratkovski et al. | 257/461 |
| 8,039,854 B2 * | 10/2011 | Hersee et al. | 257/91 |
| 2004/0109666 A1 * | 6/2004 | Kim, II | 385/147 |
| 2005/0194598 A1 | 9/2005 | Kim et al. | |
| 2006/0057360 A1 * | 3/2006 | Samuelson et al. | 428/323 |
| 2007/0122916 A1 * | 5/2007 | Oleynik | 436/524 |
| 2008/0036038 A1 | 2/2008 | Hersee et al. | |
| 2008/0149944 A1 | 6/2008 | Samuelson et al. | |
| 2010/0283064 A1 * | 11/2010 | Samuelson et al. | 257/88 |

OTHER PUBLICATIONS

Office Action issued in Chinese Application No. 200980151050.7, mailed on Nov. 21, 2012.

* cited by examiner

NANOSTRUCTURED DEVICE

TECHNICAL FIELD OF THE INVENTION

The present invention relates to nanostructured device comprising nanowires. In particular the invention relates to contacting of nanostructured LEDs.

BACKGROUND OF THE INVENTION

Nanowire based semiconductor devices such as LEDs (Light Emitting Diodes), FETs (Field Effect Transistors), diodes, solar cells and detectors are comprised of semiconductor nanowires or arrays of semiconductor nanowires grown on the surface of a substrate, for example silicon, sapphire, GaAs, GaP, GaN. Often, a planar buffer layer is grown first on the substrates and subsequently the semiconductor nanowires or the arrays of semiconductor nanowires are grown on the surface of the buffer layer. The buffer layer is used as the base layer for growing the nanowires. Additionally, it can serve for as an electrical current transport layer.

The basic process of nanowire formation on substrates is by particle assisted growth or the so-called VLS (vapour-liquid-solid) mechanism described in U.S. Pat. No. 7,335,908, as well as different types of Chemical Beam Epitaxy and Vapour Phase Epitaxy methods, which are well known. However, the present invention is limited to neither such nanowires nor the VLS process. Other suitable methods for growing nanowires are known in the art and are for example shown in the international application WO 2007/104781. From this it follows that nanowires may be grown without the use of a particle as a catalyst.

Before growth, the surface of the substrate or the buffer layer is lithographically patterned or otherwise prepared to define where to grow the nanowires. It is beneficial to have the whole area of the wafer patterned homogeneously to ensure uniform growth conditions all over the wafer.

A functional semiconductor device typically contains an active area and one or more areas where contacts are provided. For devices that utilize a buffer and/or a substrate as a current transporting means it is necessary to electrically contact this buffer layer or substrate. Prior art solutions require selective nanowire growth only in the active area or subsequent selective removal of the nanowires from the contact area such that a flat surface of the buffer or of the substrate is exposed. However, standard processes are difficult to apply for nanowire removal, since typical etch processes do not work well for this kind of structure and selective nanowire growth yields non-uniform growth conditions. The present invention offers a solution to avoid these limitations.

SUMMARY OF THE INVENTION

The In view of the foregoing, one object of the present invention is to provide a nanostructured device and a method for producing the same that may overcome at least some of the drawbacks of the prior art, as defined in the independent claims.

A nanostructured device according to the invention comprises a first group of nanowires protruding from a substrate where each nanowire of said first group of nanowires comprises for example a pn- or p-i-n-junction. A first contacting means is arranged to at least partially enclose and to electrically connect to a first side of the pn- or p-i-n-junction of each nanowire of the first group of nanowires. Further, the nanostructured device comprises a second contacting means comprising a second group of nanowires that protrudes from the substrate, and optionally, additionally electrically conductive materials. The second contacting means is arranged to electrically connect to a second side of the pn- or p-i-n-junction of the first group of nanowires.

One object of the invention is to overcome problems related to contacting nanowire structures, and in particular nanowire LED's, namely to improve process integration and decrease process time since the invention enables contacting of the terminals directly. In particular, the invention enables use of the same processing steps and homogeneous growth conditions for the entire substrate, minimizing for example edge effects and avoiding complicated nanowire removal steps. Further, the invention is applicable on all nanostructured devices with vertical nanowires that are electrically contacted from a buffer layer or a substrate.

Embodiments of the invention are defined in the dependent claims. Other objects, advantages and novel features of the invention will become apparent from the following detailed description of examples of embodiments of the invention when considered in conjunction with the accompanying drawings and claims.

BRIEF DESCRIPTION OF THE DRAWINGS

Preferred embodiments of the invention will now be described with reference to the accompanying drawings, wherein.

DETAILED DESCRIPTION OF EMBODIMENTS

In the following, the contacting of nanostructured devices is mainly described in terms of a nanostructured LED device, however not limited to this. Prior art nanostructured devices of this kind are known from for example U.S. Pat. No. 7,396,696 and WO2008048704.

In the field of art nanowires are usually interpreted as one dimensional nanostructures that is in nanometer dimensions in its diameter. As the term nanowire implies it is the lateral size that is on the nano-scale whereas the longitudinal size is unconstrained. Such one dimensional nanostructures are commonly also referred to as nanowhiskers, one-dimensional nano-elements, nanorods, nanotubes, etc. Generally, nanowires are considered to have at least two dimensions each of which are not greater than 300 nm. However, the nanowires can have a diameter or width of up to about 1 μm. The one dimensional nature of the nanowires provides unique physical, optical and electronic properties. These properties can for example be used to form devices utilizing quantum mechanical effects or to form heterostructures of compositionally different materials that usually cannot be combined due to large lattice mismatch. As the term nanowire implies the one dimensional nature is often associated with an elongated shape. However, nanowires can also benefit from some of the unique properties without having a non-elongated shape. By way of example non-elongated nanowires can be formed on a substrate material having relatively large defect density in order to provide a defect-free template for further processing or in order to form a link between the substrate material and another material. Hence the present invention is not limited to an elongated shape of the nanowires. Since nanowires may have various cross-sectional shapes the diameter is intended to refer to the effective diameter.

The nanostructured devices exemplified here, that is, LEDs, FETs, diodes and detectors, are based on one or more pn- or p-i-n-junctions arranged in different ways. The difference between a pn junction and a p-i-n-junction is that the latter has a wider active region. The wider active region allows for a higher probability of recombination in the i-region. The p-i-n-junction in a nanostructured device may be radial or axial. Embodiments according to the present invention can be applied to both kinds without leaving the scope of the invention.

Figure 1:
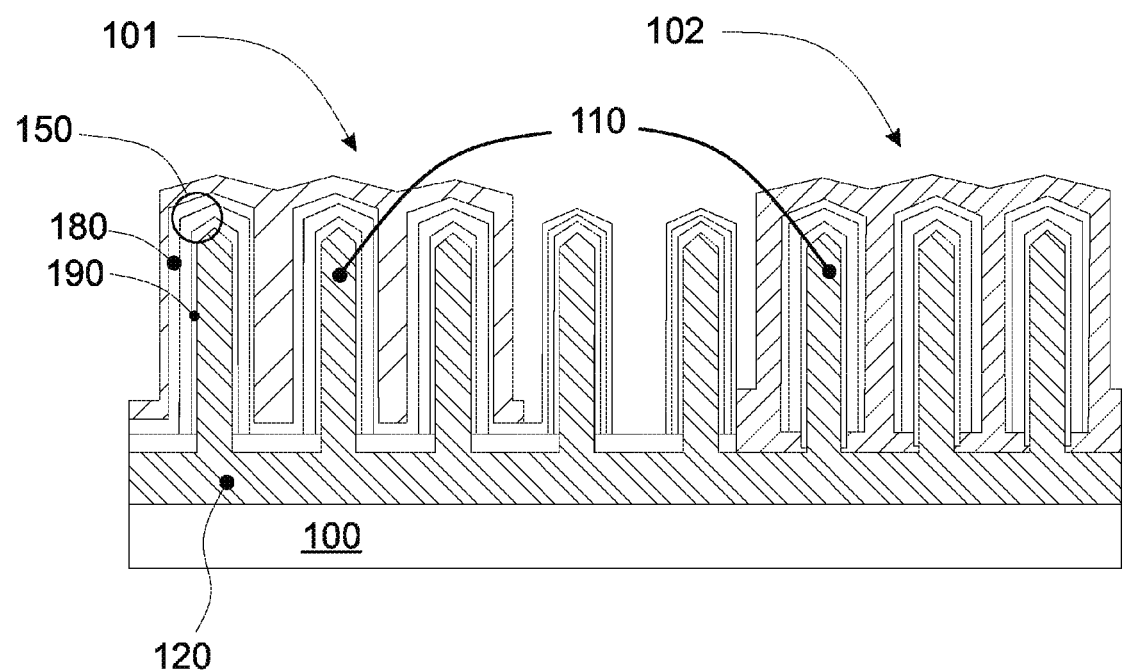
FIG. 1 shows schematically a cross section of a contacted nanowire LED, with a radial pn-junction, where the second contacting means is in electrical contact with the buffer layer.

In one embodiment of a nanostructured device according to the invention, exemplified schematically in FIG. 1 with a LED, a first group of nanowires 101 protrudes from a substrate 100 and each nanowire of the first group of nanowires (101) comprises a pn- or p-i-n-junction 150. A first contacting means at least partially encloses and is electrically connected to a first side of the pn- or p-i-n-junction 150 of each nanowire in the first group of nanowires 101. A second contacting means which comprises a second group of nanowires 102 that protrudes from the substrate 100, is arranged to be electrically connected to a second side of the pn- or p-i-n-junction 150. That is, the second group of nanowires (102) that protrudes from the substrate (100), is arranged to provide an electrical connection to a second side of the pn or p-i-n junction (150).

A dielectric or insulating layer (not shown) may be present in the bottom of a space between the nanowires 101, which, if present, can be used as a growth mask when growing the nanowires 101. This dielectric or insulating layer has to be added in the space between the nanowires of the first group of nanowires, if not present already there as a result from the previous growth of the nanowires, to avoid electrical contact between the first contact 105 and the buffer layer 120. In addition, even if the dielectric or insulating layer is present between the nanowires of the first group of nanowires already from the growth of the nanowires, another dielectric or insulating layer may have to be added on top of the already existing insulating layer, to achieve a proper electrical insulation between the first contact 105 and the buffer layer 120. Electrical contact between the first contact 105 and the buffer layer would, as can be interpreted from FIG. 1, result in a short circuit.

The contacts comprised in both the first and the second contacting means may be a metal or a semiconductor. In the case of a metal, it can be any metal having high electrical conductivity, like for example Al, Ti, Ag, Cu etc, or alloys thereof. In the case of a semiconductor material it has to be electrically conducting, which is achieved by a high doping (about $10^{16}/cm^{-3}$ and more) concentration of the material. The semiconductor can be for example highly doped GaN, InP, GaAs, AlInGaN, AlGaN and InGaN etc.

In one embodiment, when growing the nanowires, a mask 90 can be deposited onto the substrate 100 or the buffer layer 120 (in the following called just the buffer layer 120). The mask 90, preferably a dielectric and insulating material like $SiO_2$, $Si_3N_4$, and $Al_2O_3$ is patterned using for example lithography, defining the areas in the mask 90 wherefrom the nanowires are intended to grow. After growing the nanowires, the mask is still covering the buffer layer 120 in a space in between the nanowires. By removing the mask 90 in the space in between the nanowires for the second group of nanowires 102, and subsequently depositing a contact layer, electric contact can be made directly to the buffer layer 120. By letting the second contacting means 102 be in direct electrical contact with the buffer layer 120, contact is also made to the core of the nanowires of the first group of nanowires 101. The methods of removing the mask layer only are readily available and comprise wet etch methods using for example HF, HCl or dry etch methods using for example $CF_4$, $SF_6$ together with other reactive gasses. If the growth method used does not require the mask layer 90 to grow the nanowires, electrical insulation between the first contact and the buffer layer 120 is preferably arranged by adding a dielectric or insulating layer in between the nanowires of the first group of nanowires. Even if a dielectric or insulating layer already is present between the nanowires of the first group of nanowires, said layer may have to be complemented by another dielectric or insulating layer.

The pn- or p-i-n-junction surrounding the nanowires, as seen in FIG. 1, is grown radially, with an n-side 190 of the pn- or p-i-n-junction 150 as an inner layer in direct contact with a nanowire core 110. In the following, the wording p-i-n-junction 150 is intended to include both pn- and p-i-n-junctions 150 unless otherwise indicated.

In the embodiment in FIG. 1 of a nanostructured LED according to the invention, the nanowires protrude from the substrate 100. The substrate 100 can be Si, Ge, $Al_2O_3$, SiC, Quartz, glass, GaN or any other material suitable for nanowire growth. The substrate 100 can also be covered with a buffer layer 120 prior to nanowire growth. The buffer layer 120 can be made of a material which is different to the substrate material. The buffer layer 120 is preferably chosen so as to match the desired nanowire material, and thus form a growth base for the nanowires later in the process. Matching means that the buffer layer 120 is chosen so that the lattice parameters of the nanowires and the buffer layer 120 admit nanowire growth. The growth of nanowires can be achieved by utilizing methods described in the above referred applications (U.S. Pat. No. 7,396,696 and WO2008048704), in which well-known mask techniques result in nanowires with a p-i-n-junction 150. The nanowires can be of any semiconductor material, although the most common materials found are III-V semiconductors, such as GaN, InP, GaAs, AlInGaN, AlGaN and InGaN etc.

There are several ways that the nanowires can be contacted by the second contacting means and these depend on the contacting method and contact material. The deposition or growth method may be a CVD method for growing contact layers of semiconductor material like GaN, InP, GaAs, AlInGaN, AlGaN and InGaN etc., whereas a PVD method is preferred for deposition of metal contact materials like Al, Ag, Cu or any other metal having reasonably high conductivity. Also alloys exhibiting the desired physical properties may be used.

The second contacting means, i.e. the second group of nanowires 102, which in the case of a nanowire grown for radial pn-junctions is intended to contact the core 110 of the first group of nanowires 101 and in case of the nanowire grown for axial pn-junctions intended to contact the bottom portion of the first group of the nanowires, may depending on the deposition or growth method used, either be covered by the contact material on a top portion of the nanowires, semi-covered which means that the contact material extends down in between the nanowires, or fully covered which means that substantially no surface area of the nanowires comprised within the second group of nanowires 102 lacks contact with the contact material.

In one embodiment of the present invention, the first contacting means is connected to the p-side 180 of the p-i-n-junction 150 and the second contacting means comprises a second group of nanowires a second contact that is connected to the n-side 190 of the p-i-n-junction 150 of the nanowires of the first group of nanowires. The second contact, intended to electrically connect to the nanowire core 110 or the bottom part of the axially grown p-n or p-i-n junction of the first group of nanowires 101 through the second group of nanowires 102, may be arranged in several ways. In this embodiment the nanowires of the first and second groups are preferably processed in parallel on the substrate, whereby the nanowires initially after growth are substantially the same. The second contact may cover the second group of nanowires 102 on top of the layers forming the p-i-n-junction 150, or one or more layers of the p-i-n-junction 150 may be removed prior to deposition or growth of the second contact, offering an improved electrical contact to the buffer layer 120. In one embodiment of the present invention, illustrated in FIGS. 2a to 2e, substantially all the layers comprised in the p-i-n-junction 150 of the nanowires of the first group of nanowires are completely removed on the second group of nanowires 102. This can be achieved by etching, and offers a very good electrical contact because of the large contact area between the nanowire core and the second contact. One or more layers surrounding the nanowire core, which are of the same conductivity type as the nanowire core or intrinsic (intrinsic here meaning that the layer neither has a strong p- or n-charge build up, but are in a sense close to neutral) can be left on the nanowire core, without impairing the contact properties.

In addition, during removal of the layers surrounding the second group of nanowires, some etching may occur even on the nanowire core. In extreme cases, only a small part of the nanowire may be left onto the substrate of buffer layer. However, partial etching of the nanowire before contacting does not ruin the possibility to use the nanowires for contacting purposes.

Figure 2A:
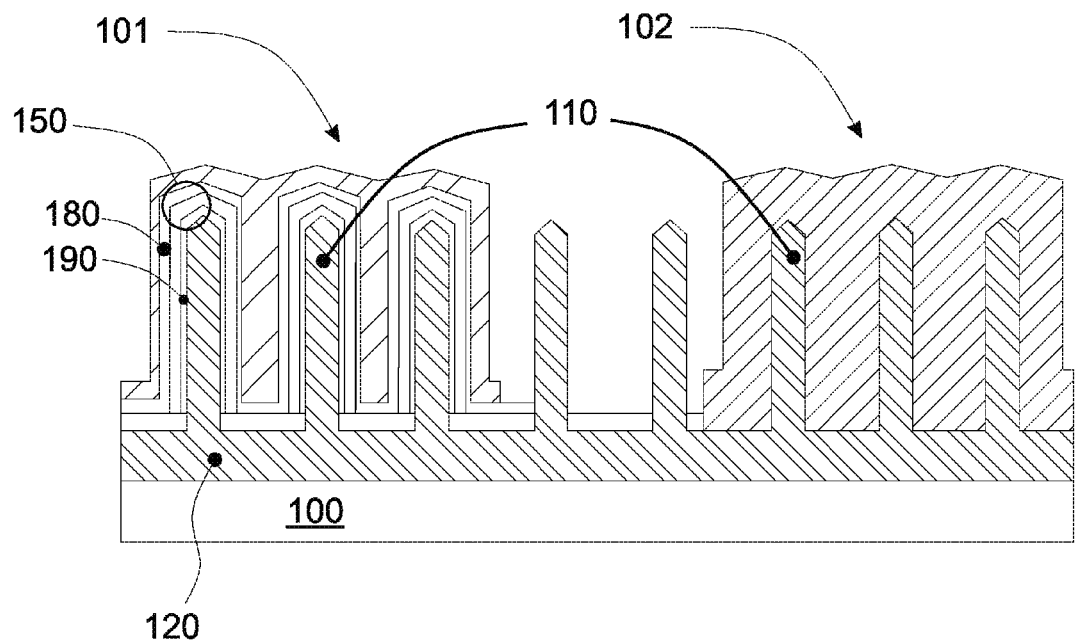
FIGS. 2a to 2e shows schematically a cross section of a contacted nanowire LED, with a radial pn-junction, where the second contacting means is in electrical contact with the buffer layer and the core of the nanowires of the second first group.

The second contact may thus form electrical contact with the buffer layer or the substrate by forming a physical contact either only with the buffer layer, or, in addition, by forming a physical contact with the nanowire core of the second group of nanowires. When the layers forming the p-i-n-junction are not removed from the second group of nanowires, the active contact area is the contact between the re-contact material and the buffer layer, and the p-i-n-junction on the second group of nanowires is electrically inactive, since it is short-circuited by the second contact. Hence, all the surface area on the nanowire covered by the layers forming the p-i-n-junction is also essentially electrically inactive. This situation is seen in FIG. 1. In the case where the layers forming the p-i-n-junction are removed, the contact area is greatly increased, and the surface area on the nanowire is electrically active, taking part in the conduction of charges to the buffer layer, as seen in FIG. 2a.

Figure 2B:
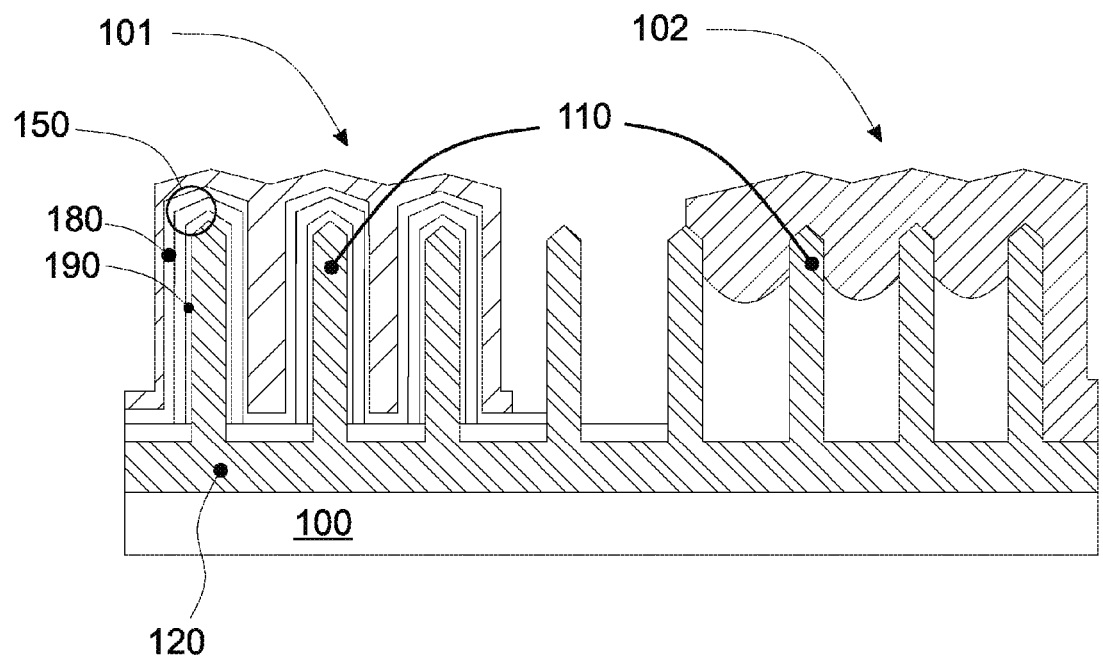

In FIG. 2b, a situation is illustrated, where all the layers comprised in the p-i-n-junction 150 are completely removed on the second group of nanowires 102, such that the second contact deposited on the nanowires of the second group of nanowires comes in electrical contact with the nanowire core. However, due to physical conditions and deposition techniques, it is sometimes difficult to reach the bottom of the space between nanowires, thus the second contact may not extend all the way down to the buffer layer in that region. In that case, electrical contact is preferentially made only with a top portion of the nanowires of the second group of nanowires. The same situation may occur also in the first group of nanowires, and if so, only the part of the nanowires of the first group of nanowires covered with contact material will be electrically active.

Figure 2C:
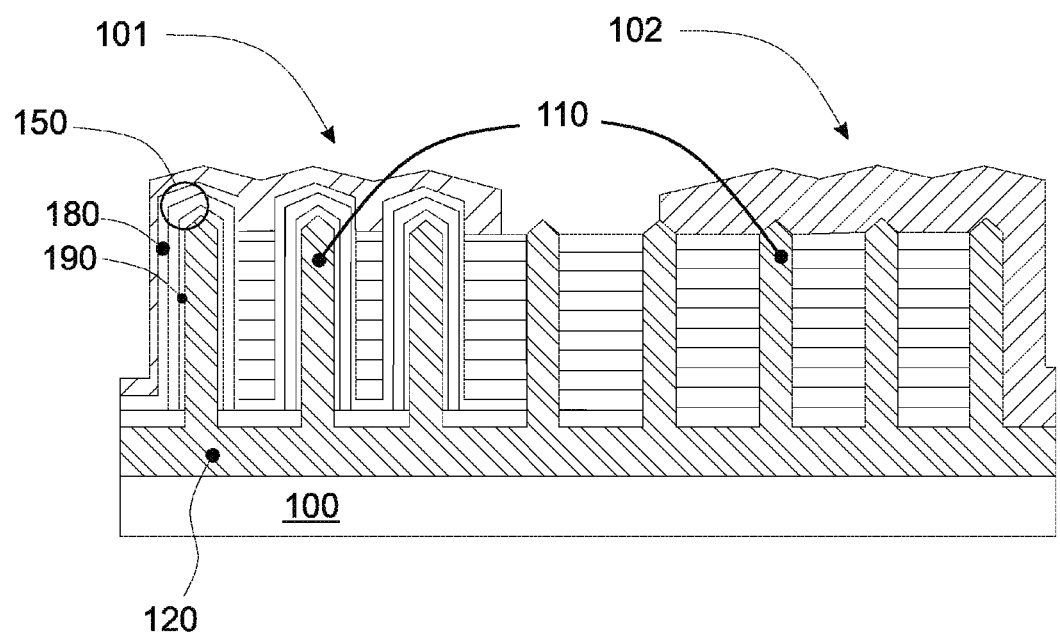
Figure 2D:
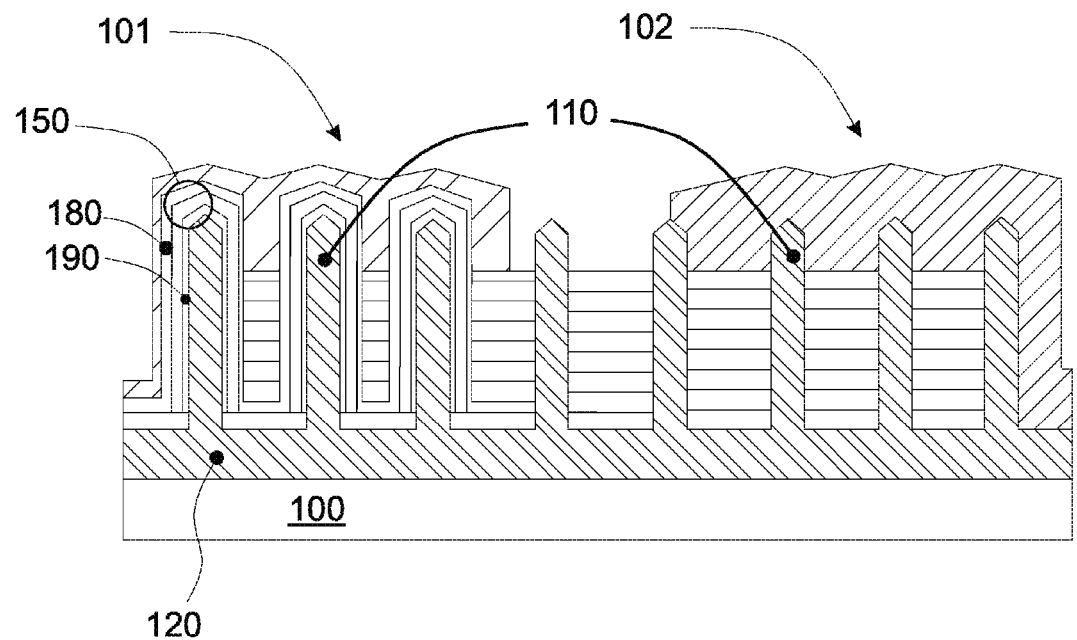

In another situation, illustrated in FIG. 2c, the space between nanowires is at least partly filled with an insulating material, and only the top portion of the nanowires of both the first group and the second group of nanowires is contacted. In addition, the space between the nanowires may be semi-filled with the insulating material, such that the insulating material fills the space between the nanowires to a level somewhere between the bottom of the nanowire and the top of the nanowire, for example like illustrated in FIG. 2d. The contact material may then fill the rest of the space between the nanowires, and may be in contact with the insulating material as shown in the figure.

Figure 2E:
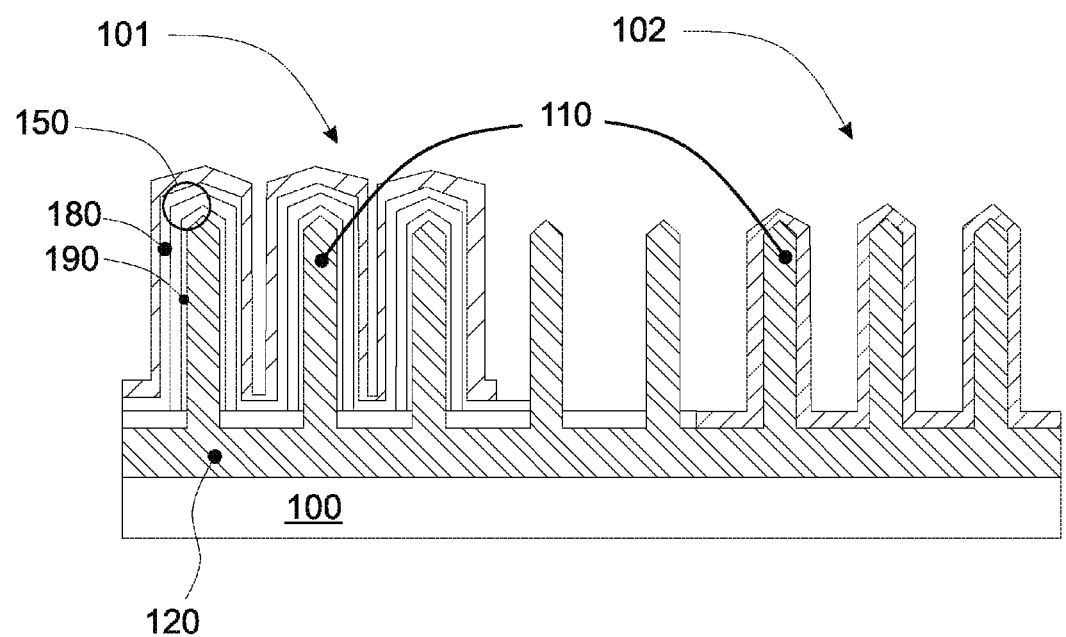

Further, the contacting process may result in a situation where the contact material is applied to the nanowires such that it follows the contours of the nanowires, and the space between nanowires remains, as illustrated in FIG. 2e.

Figure 4:
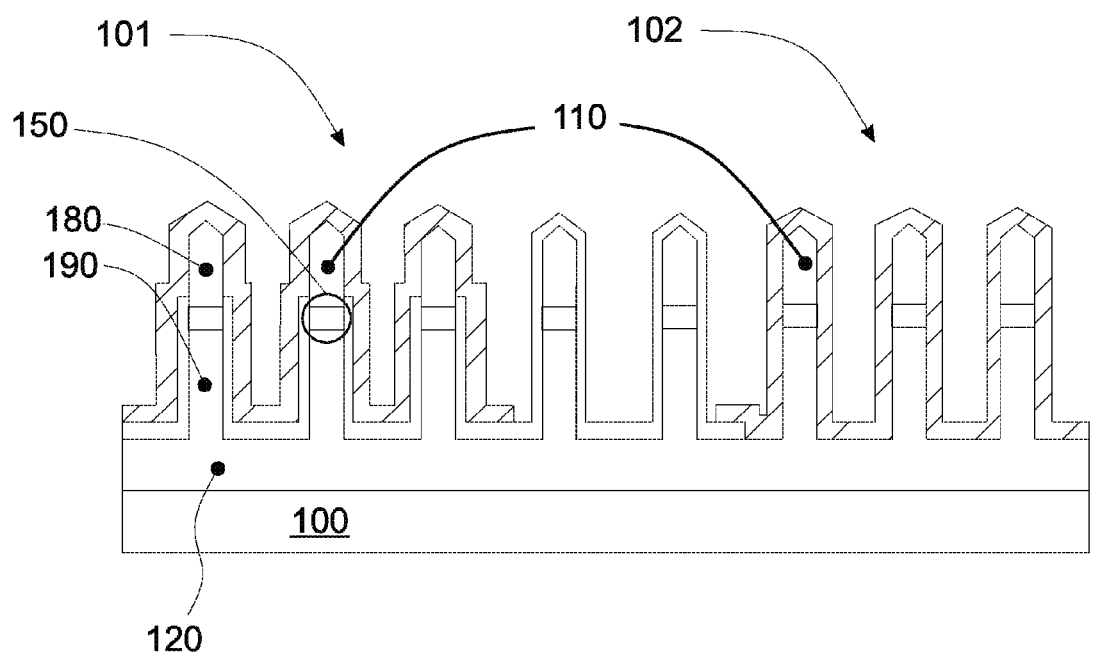
FIG. 4 shows schematically a cross section of a contacted nanowire LED, with an axial pn-junction, where the second contacting means is in electrical contact with the buffer layer and the bottom portion of the nanowires of the second group.

In another embodiment of the present invention, schematically illustrated in FIG. 4, the method of contacting nanowires according to the invention is applied to nanowires comprising axial pn-junction. In this case a top portion, corresponding to for example a first side of a pn-junction, of the nanowires from the first group of nanowires is contacted by the first contacting means. The bottom portion, which in the case of a nanowire comprising an axial pn-junction, corresponding to for example a second side of a pn-junction of the nanowires from the first group of nanowires, is contacted through the buffer layer via the second contacting means.

In another embodiment of the present invention, one way to contact the nanowires is to partly remove the p-i-n-junction in a top portion of the nanowires of the second group of nanowires 102. That is, to open up the top portion of the nanowires of the second group of nanowires to expose the nanowire core. This enables direct electrical contact between the core 110 of the second group of nanowires 102 and the second contact of the second contacting means. The top portion of nanowires of the second group of nanowires 102 may be removed by etching or by chemical mechanical polishing (CMP).

Moreover, it is by etching possible to remove any layers covering the buffer layer 120 in a space in between the nanowires of the second group of nanowires. This exposes the buffer layer in the space between these nanowires, thus enables the possibility to contact the buffer layer 120 with the second contact in this space. This provides for a direct electrical contact between the second contact and the buffer layer 120. In addition, by employing a suitable etch recipe, both the core 110 of the second group of nanowires 102, and the buffer layer 120 in between the second group of nanowires 102, may be uncovered. This offers a very large area to arrange the second contact as shown in FIG. 2a and helps to ensure a proper electrical contact.

Figure 3:
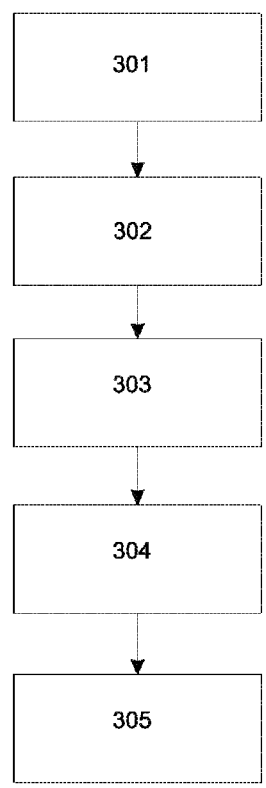
FIG. 3 shows steps comprised in the method of forming a nanostructured LED.

In one embodiment of the present invention schematically illustrated in FIG. 3, the method of forming the nanostructured LED comprises the steps of providing a substrate 100, which can be a semiconductor substrate, for example silicon; forming a first group of nanowires 101 and a second group of nanowires 102 on the substrate 100 or, prior to forming the nanowires, forming a buffer layer 120 on the substrate and subsequently forming the first group of nanowires 101 and the second group of nanowires 102; forming a pn- or p-i-n-junction 150 on each nanowire, that encloses the nanowire core 110; forming a first contacting means that at least partially encloses and electrically connects to a first side of the pn- or p-i-n-junction 150 of each nanowire in the first group of nanowires 101; forming a second contacting means comprising the second group of nanowires 102 protruding from the substrate 100, arranged to electrically connect to a second side of the pn- or p-i-n-junction 150 of the first group of nanowires.

In another embodiment of the present invention, the method of removing predefined areas on a top portion of each nanowire of the second group of nanowires 102 comprises etching. It may be a chemical etch or it may be a physical etch depending on the desired profile. The etch may be either a wet etch using chemical baths or a dry etch using vacuum equipment.

In yet another embodiment of the present invention, the method of removing predefined areas on a top portion of each nanowire of the second group of nanowires 102 comprises chemical mechanical polishing (CMP).

While the embodiments of the invention have been illustrated by examples where the nanowire is of n-type material, it is conceivable to use nanowire cores of p-type material in which case it would be possible to have a p-side as the inner layer.

The embodiments show examples of contacting of devices comprising radially and axially grown p-i-n-junctions, although the invention would obviously be applicable on any nanostructured device, given that at least one terminal is being supplied and electrically contacted via the bottom portion of the nanowire through the substrate or buffer layer. Many semiconductor devices are comprised of one or more p-i-n-junctions, whereby the nanowire technology enables the formation of various semiconductor devices comprising a p-i-n-junction, or devices comprising several junctions by combining two or more p-i-n-junctions.

In one embodiment of a nanostructured device, a first group of nanowires are protruding from a buffer layer 120 where each nanowire comprises a radial pn- or p-i-n-junction. A first contacting means comprises a first contact that at least partially encloses and electrically connects to a first side of the pn- or p-i-n-junction of each nanowire in the first group of nanowires. A second contacting means is arranged to electrically connect, via the buffer layer 120, to a second side of the radial pn- or p-i-n-junction.

In this description, the term the "first side of the p-i-n-junction 150" refers to the p-side, and the term the "second side of the p-i-n-junction 150" refers to the n-side. Nevertheless, this can be altered without leaving the scope of the invention.

The correct choice of contact material for the contacts comprised in the first and the second contacting means leads to increased performance. The contact material should preferably be able to form a good ohmic contact to the material it is intended to contact. That is, the current-voltage (I-V) characteristics of the contact shall be predictable and linear. If these I-V-characteristics are non-linear and asymmetric, then the behaviour of the contact is more like a diode-like behaviour, which is not desired for a contact. Contacts on semiconductor materials are commonly deposited using physical vapour deposition (PVD) methods like sputtering of evaporation, but also chemical vapour deposition (CVD) methods may be used. Suitable materials for use in metal contacts on semiconductors are Al, Ag, Cu, Ti, Au or Pd. However, alloys of the metals mentioned may also be used. The properties of the metals and metal alloys are high electrical conductivity and compatibility with the total material system. Also non-metallic contact materials may be used, such as highly doped semiconductor materials.

In one embodiment of the present invention a method of forming a nanostructured device comprises the steps of:
- 301 providing a substrate;
- 302 forming a first and a second group of nanowires on a substrate;
- 303 forming a radial pn- or p-i-n-junction 150 at least partially covering each nanowire;
- 304 forming a first contacting means comprising a first contact that at least partially encloses and electrically connects to a first side of the pn- or p-i-n-junction 150 of each nanowire in the first group of nanowires;
- 305 forming a second contacting means arranged comprising a second contact to electrically connect, via the buffer layer 120 and a top portion of the nanowires of the first group of nanowires, to a second side of the radial pn- or p-i-n-junction 150. That means that a top portion of the nanowire core of nanowires of the second group of nanowires needs to be accessible. A first way to do this is to selectively form the pn-junction 150 on the nanowire, covering a substantial part of the circumferential outer surface area of the nanowire, but leaving the top portion open.

A second way to do this is to form the pn-junction 150 onto the entire circumferential surface area of the nanowire and subsequently remove the layers comprised in the pn-junction 150 on a top portion of the nanowire on the second group of nanowires, thereby exposing the nanowire core. This can be done, for example, by etching. Depending on the material system used, dry etching using a vacuum system and suitable gases or wet etching using suitable liquids may be used. The pn-junction 150 covering the circumferential surfaces of the nanowire may then be contacted by the first contacting means, and the top portion of the nanowire with the exposed nanowire core, may then be contacted by the second contact. The second contact may thus be arranged to contact both the top portion of the nanowire as well as the buffer layer 120 in contact with the nanowire core. Yet another way to contact the second group of nanowires is to uncover the nanowires of the second group of nanowires from its surrounding layers, and form a second contact that at least partly encloses the nanowires of the second group of nanowires.

In another embodiment of the present invention, the method to remove the layers forming the pn-junction 150 on the top portion of the nanowires comprises chemical mechanical polishing (CMP). In CMP, a slurry comprising very small abrasive particles of nano-meter size together with a chemical mixture adapted for the material system in question is used to mechanically and chemically remove the material on the top portion of the nanowires. This results in a very smooth surface, and exposes the nanowire core on a top portion of the nanowire.

It should be appreciated that a top portion of the nanowires of the first group of nanowires may be exposed in the same way as described above.

In one embodiment of the present invention the nanostructured device is a LED, and a nanowire LED is intended to either emit light from the top of the nanowire or from the bottom of the nanowire, and this has to be taken into account when choosing the contact materials. In the case of a bottom emitting nanowire LED, the top contact material can be a reflecting layer like silver or aluminum, but for a top emitting nanowire LED, the top contact material needs to be transparent. Silver, among the metals, has the best reflection coefficient in the visible region of the optical spectra, but is more prone to exhibit corrosion damage in normal atmosphere if not capped inside a structure. $Si_3N_4$, $SiO_2$, $Al_2O_3$ or any other stable dielectric can be used as a capping layer. Aluminum has a reflective index in the visible region somewhat lower than silver, but exhibits very good corrosion resistance in dry atmospheric environments. In order to improve device reliability additional dielectric capping as described above may still be desired. In the case of a transparent top contact layer, Indium Tin Oxide (ITO), or other transparent compounds or highly doped semiconductors having high electrical conductivity and transmittance may be used.

While the invention has been described in connection with what is presently considered to be the most practical and preferred embodiments, it is to be understood that the invention is not to be limited to the disclosed embodiments. On the contrary, is intended to cover various modifications and equivalent arrangements within the scope of the appended claims.

The invention claimed is:

1. A nanostructured device comprising:
    a first group of nanowires protruding from a substrate where each nanowire of the first group of nanowires comprises at least one pn- or p-i-n-junction,
    a first contacting feature that at least partially encloses and electrically connects to a first side of the pn- or p-i-n-junction of each nanowire in the first group of nanowires, and
    a second contacting feature, which comprises a second group of nanowires that protrudes from the substrate, and which is arranged to provide an electrical connection to a second side of the pn or p-i-n junction of each nanowire in the first group of nanowires,
    wherein the pn- or p-i-n junction of each nanowire in the first group of nanowires in operation provides an active region for charge carrier recombination for generation of light such that the nanostructured device functions as a LED device,
    wherein the second contacting feature further comprises a second contact at least partly enclosing the nanowires of the second group of nanowires, and
    wherein a pn- or p-i-n junction of each nanowire in the second group of nanowires is shorted by the second contact to render the second group of nanowires electrically inactive.

2. The nanostructured device according to claim 1, wherein the substrate comprises a buffer layer adjacent to the nanowires.

3. The nanostructured device according to claim 1, wherein the second contact is in direct electrical contact with at least one of the buffer layer or the substrate such that the electrical connection to the second side of the pn or p-i-n junction is provided at least partly via at least one of the buffer layer or the substrate.

4. The nanostructured device according to claim 3, wherein each nanowire of the first and second groups of nanowires comprise a core and a shell layer that at least partly encloses the core, whereby a pn-junction or p-i-n-junction is formed by the core and the shell.

5. The nanostructured device according to claim 1, wherein the second contact is in electrical contact with the core of the nanowires of the second group of nanowires such that the electrical connection to the second side of the pn or p-i-n junction is provided at least partly via the cores.

6. The nanostructured device according to claim 5, wherein the second contact is electrically insulated from the buffer layer or the substrate, whereby the electrical connection to the second side of the pn- or p-i-n junction is provided via a conduction path extending from the second contact via the cores of the nanowires of the second group of nanowires to at least one of the buffer layer or the substrate, and to the second side of the pn- or p-i-n-junction.

7. The nanostructured device according to claim 1, wherein each nanowire of the first and second groups of nanowires have been simultaneously grown in the same process step.

8. The nanostructured device according to claim 1, wherein the first contacting feature is connected to the p-side and the second contacting feature is connected to the n-side.

9. The nanostructured device according to claim 1, wherein a nanowire core is exposed and contacted in an end portion of the second group of nanowires.

10. Method of forming a nanostructured device comprising the steps of:
    providing a substrate,
    growing a first group of nanowires and a second group of nanowires on the substrate or a buffer layer on the substrate,
    forming a pn- or p-i-n-junction in each of the nanowires of the first and second groups of nanowires,
    forming a first contact that at least partially encloses and electrically connects to a first side of the pn or p-i-n junction of each nanowire in the first group of nanowires, and
    forming a second contact that at least partly encloses the nanowires of the second group of nanowires, whereby the second contact forms part of an electrical connection to a second side of the pn- or p-i-n-junction of each nanowire in the first group of nanowires,
        wherein the pn- or p-i-n junction of each nanowire in the first group of nanowires in operation provides an active region for charge carrier recombination for generation of light such that the nanostructured device functions as a LED device, and
        wherein the pn- or p-i-n junction of each nanowire in the second group of nanowires is shorted by the second contact to render the second group of nanowires electrically inactive.

11. Method of forming a nanostructured device according to claim 10, wherein the step of growing comprises growing a shell layer enclosing the nanowires.

12. Method of forming a nanostructured device according to claim 10, wherein the step of forming the second contact comprises uncovering the nanowire from surrounding layers on the second group of nanowires, and forming a second contact that at least partly encloses the nanowires of the second group of nanowires.

13. Method of forming a nanostructured device according to claim 10, wherein the second contact is in direct contact with at least one of the buffer layer or the substrate.

14. The method according to claim 10, wherein the first and second groups of nanowires are formed simultaneously in the same process step.

15. The method of forming a nanostructured device according to claim 10, wherein a nanowire core is exposed in an end portion of the second group of nanowires.

16. The method of forming a nanostructured device according to claim 15, wherein a predefined portion of the nanowires of the first and second group of nanowires is removed using at least one of chemical mechanical polishing (CMP) or etching.

* * * * *